United States Patent
Ohno et al.

(10) Patent No.: US 6,482,729 B2
(45) Date of Patent: Nov. 19, 2002

(54) METHOD OF GENERATING SPIN-POLARIZED CONDUCTION ELECTRON AND SEMICONDUCTOR DEVICE

(75) Inventors: Hideo Ohno, Sendai (JP); Fumihiro Matsukura, Sendai (JP)

(73) Assignee: Tohoku University, Sendai (JP)

( * ) Notice: Subject to any disclaimer, the term of this patent is extended or adjusted under 35 U.S.C. 154(b) by 0 days.

(21) Appl. No.: 09/799,722

(22) Filed: Mar. 7, 2001

(65) Prior Publication Data
US 2001/0031547 A1 Oct. 18, 2001

(30) Foreign Application Priority Data
Mar. 7, 2000 (JP) .................................. 2000-061721

(51) Int. Cl.$^7$ ............................................. H01L 21/28
(52) U.S. Cl. .................................. 438/602; 257/103
(58) Field of Search .................. 438/602; 257/103; 324/43

(56) References Cited
U.S. PATENT DOCUMENTS
6,043,515 A * 3/2000 Kaisha ....................... 257/103

OTHER PUBLICATIONS

D Kahng, T.A. Shankoff, T.T. Sheng and S.E. Haszko; "A Method for Area Saving Palnar Isolation Oxides Using Oxidation Protected Sidewalls", Nov. 1980, J Electrochem. Soc.: Solid State Sceince and Technology; Pg 2468–2471.*

* cited by examiner

Primary Examiner—John F. Niebling
Assistant Examiner—Andie C Stevenson
(74) Attorney, Agent, or Firm—Oliff & Berridge, PLC

(57) ABSTRACT

A semiconductor device for generating spin-polarized conduction electrons including a ferromagnetic semiconductor layer and a non-magnetic semiconductor layer having a band alignment of Type II with respect to the ferromagnetic semiconductor, said ferromagnetic semiconductor layer and non-magnetic semiconductor layer being connected together directly or with interposing therebetween another non-magnetic semiconductor layer or energy barrier layer such that a spin splitting of a conduction band of the non-magnetic semiconductor layer is induced by a spontaneous spin splitting of a valence band of the ferromagnetic semiconductor layer, and spin-polarized conduction electrons are generated in the non-magnetic semiconductor layer by the spin splitting of the conduction band of the non-magnetic semiconductor layer.

7 Claims, 6 Drawing Sheets

⚑ : Spin-polarized hole

⚐ : Spin-polarized electron

METHOD OF GENERATING SPIN-POLARIZED CONDUCTION ELECTRON AND SEMICONDUCTOR DEVICE

BACKGROUND OF THE INVENTION

1. Field of the Invention

The present invention relates to a method of generating spin-polarized conduction electrons in a semiconductor device. The present invention also relates to a semiconductor device in which spin-polarized conduction electrons are generated.

2. Related Art Statement

Generation of spin-polarized conduction electrons in a semiconductor material newly applies spin degree of freedom to semiconductor electronic materials, and has been studied towards a future device application. Semiconductor devices generating such spin-polarized conduction electrons are expected to realize a novel application to a spin field effect transistor, a spin-polarized scanning tunneling microscopy, a spin memory device, a circularly polarized light emitting device, etc.

In a conventional technology of generating spin-polarized electrons, spin-polarized electrons are injected into a semiconductor body by using metallic magnetic electrodes. However, in this known method, the spin-polarization generated within the semiconductor body is changed only slightly owing to the Schottky barrier produced at a metal/semiconductor interface.

It is possible to generate spin-polarized electrons by replacing a part of atoms constituting a semiconductor material with magnetic atoms to convert the non-magnetic semiconductor material into a magnetic semiconductor material. However, since the interaction between magnetic spins and electrons is small, the spin polarization is produced only slightly. On the other hand, the interaction between holes in such a magnetic semiconductor and magnetic spins is relatively large and it is possible to give big spin polarization to holes. But a spin relaxation time is very short because of the spin-orbit interaction, and thus the application to the field of electronics is difficult.

SUMMARY OF THE INVENTION

Therefore, the purpose of this invention is to provide a method of generating effectively spin-polarized electrons (carriers in the conduction band) within a semiconductor.

It is another object of this invention to provide a semiconductor device, in which spin-polarized conduction electrons can be effectively generated.

According to the invention, a method of generating spin-polarized conduction electrons, characterized in that the method comprises a step for providing a ferromagnetic/non-magnetic heterojunction between a ferromagnetic semiconductor layer and a non-magnetic semiconductor layer having an energy band alignment of Type II with respect to the ferromagnetic semiconductor layer such that a spin splitting of a conduction band of the non-magnetic semiconductor layer is induced by a spontaneous spin splitting of a valence band of the ferromagnetic semiconductor layer to generate spin-polarized conduction electrons in the non-magnetic semiconductor layer.

In the Type II energy band alignment of semiconductor layers, a top of the valence band of one semiconductor layer is located above a bottom of the conduction band of the other semiconductor layer in the energy band diagram. If the ferromagnetic semiconductor layer is connected to the non-magnetic semiconductor layer having the energy band alignment of Type II with respect to the ferromagnetic semiconductor layer, the spontaneous spin splitting of the valence band of the ferromagnetic semiconductor layer induces the spin splitting of the conduction band of the adjacent non-magnetic semiconductor layer and spin-polarized electrons are generated in the non-magnetic semiconductor layer.

According to the invention, a semiconductor device, characterized in that the device comprises a ferromagnetic semiconductor layer, and a non-magnetic semiconductor layer having an energy band alignment of Type II with respect to the ferromagnetic semiconductor, said ferromagnetic semiconductor layer and non-magnetic semiconductor layer being connected to form a ferromagnetic/non-magnetic heterojunction such that a spin splitting of the conduction band of the non-magnetic semiconductor layer is induced by a spontaneous spin splitting of the valence band of the ferromagnetic semiconductor layer to generate spin-polarized conduction electrons in the non-magnetic semiconductor layer.

The method for generating the spin-polarized conduction electrons according to the invention utilizes the fact that the spontaneous spin splitting of the valence band is induced in the magnetic semiconductor, and when the magnetic semiconductor is adjoined to the non-magnetic semiconductor having the energy band alignment of Type II with respect to the magnetic semiconductor layer, the spin splitting of the conduction band of the non-magnetic semiconductor is induced by said spontaneous spin splitting of the valence band of the magnetic semiconductor to generate spin-polarized electrons in the non-magnetic semiconductor.

DESCRIPTION OF THE PREFERRED EMBODIMENTS

As explained above, the junction of semiconductors in which the conduction band of one semiconductor and the valence band of the other semiconductor are partially overlapped with each other is called the Type II junction. Now the Type II junction between a non-magnetic semiconductor and a ferromagnetic semiconductor used in the method according to the invention will be explained in comparison with the conventional Type II junction between non-magnetic semiconductors.

Figure 1:
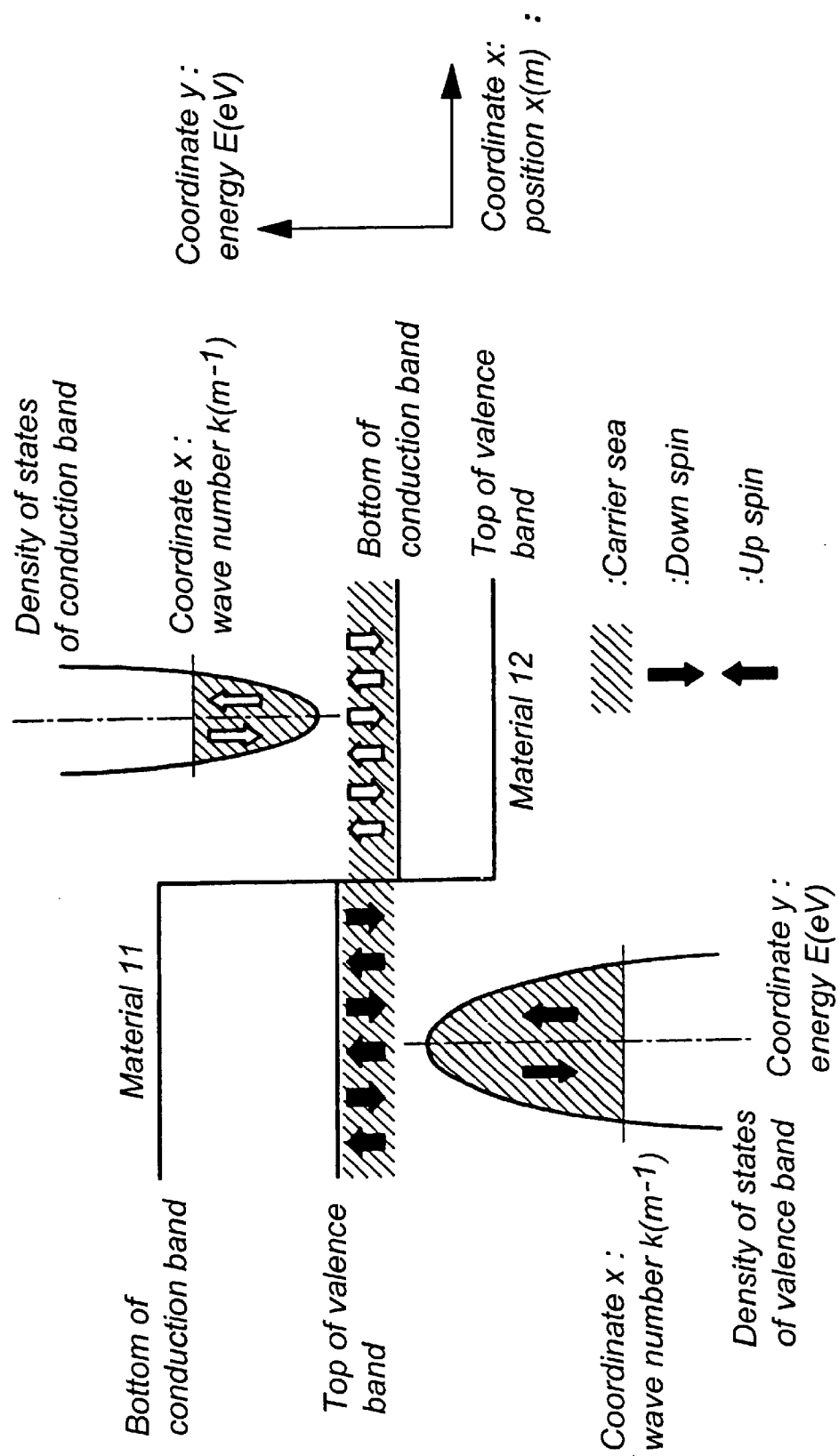
FIG. 1 is a schematic diagram showing the conventional junction of non-magnetic semiconductors.

FIG. 1 is a schematic diagram showing the conventional Type II junction of semiconductors. In this junction, a material 11 is a non-magnetic semiconductor such as GaSb, and a material 12 is a non-magnetic semiconductor such as InAs. These semiconductor materials reveal the Type II band alignment upon being connected each other. A graph shown in a lower left of the drawing of FIG. 1 expresses the density of states of the valence band of the material 11, and a graph shown in an upper right represents the density of states of the conduction band of the material 12. In these graphs, a vertical coordinate y denotes energy E (eV) and a horizontal coordinate x represents wave number k ($m^{-1}$). At a middle area of the diagram, there is shown the energy band in this junction, wherein a vertical coordinate y denotes energy E (eV) and a horizontal coordinate x represents a position x(m). In the conventional junction, the spin splitting of the density of states of the valence band of the material 11 is not occurred, and therefore the spin polarization is not induced on the conduction band of the material 12.

Figure 2:
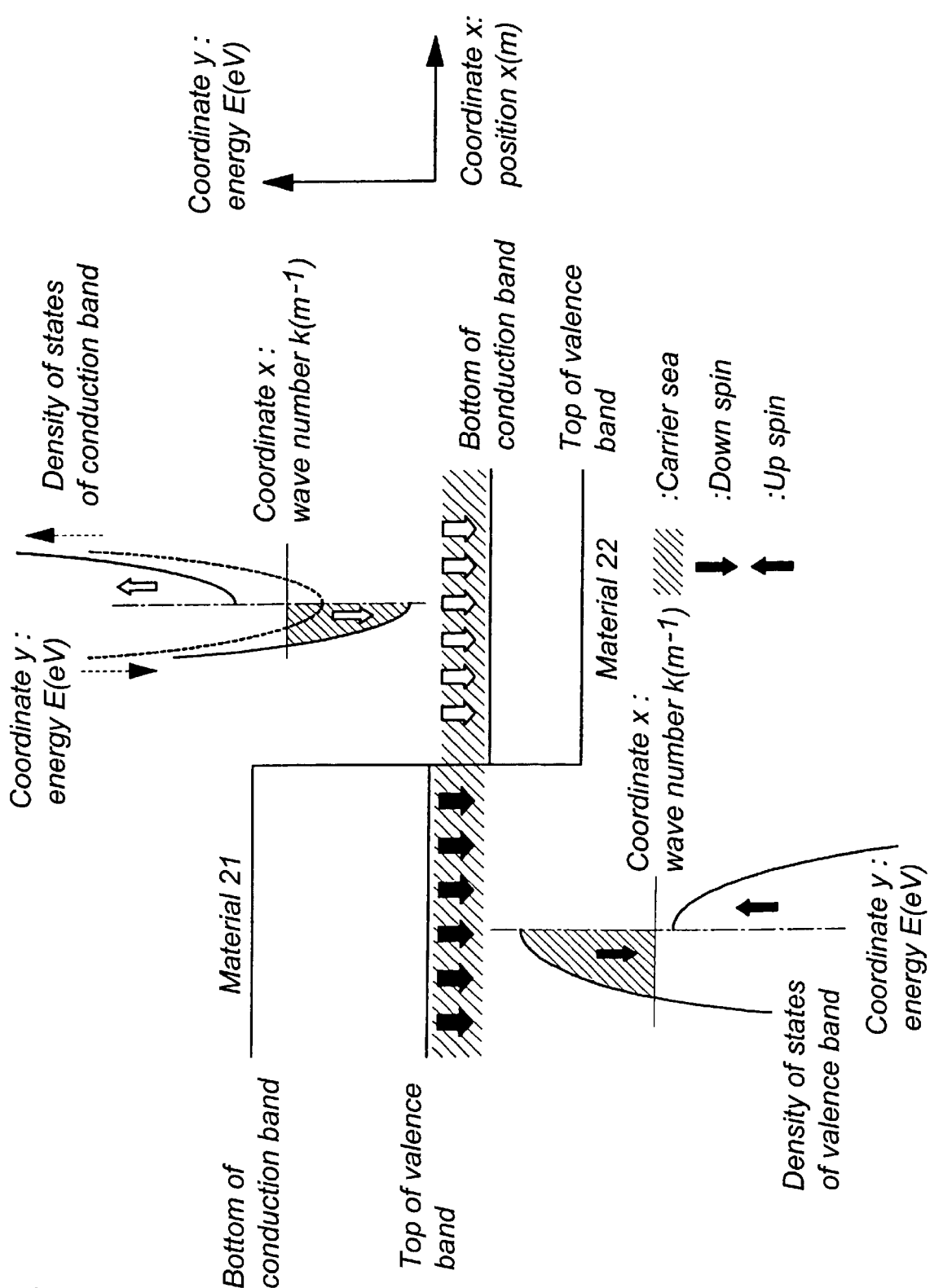
FIG. 2 is a schematic diagram illustrating the ferromagnetic/non-magnetic heterojunction according to the invention.

FIG. 2 shows the ferromagnetic/non-magnetic semiconductor heterojunction of Type II used in the method of generating the spin-polarized conduction electrons according to the invention. In this ferromagnetic/non-magnetic semiconductor heterojunction, a material 21 is the ferromagnetic semiconductor such as (Ga,Mn)Sb, and a material 22 is the non-magnetic semiconductor such as InAs. When these semiconductor materials are connected to each other, the Type II band alignment is obtained. Similar to FIG. 1, a lower left graph of FIG. 2 expresses the density of states of the valence band of the material 21 and an upper right graph denotes the density of states of the conduction band of the material 22, wherein a vertical coordinate y denotes the energy E (eV) and a horizontal coordinate x represents the wave number k ($m^{-1}$). Furthermore, a middle graph of FIG. 2 shows the energy band in this junction, wherein a vertical coordinate y shows the energy E (eV) and a horizontal coordinate x denotes the position x(m). In such a ferromagnetic/non-magnetic semiconductor heterojunction, the spin splitting of the valence band of the ferromagnetic semiconductor material 21 occurs spontaneously due to the exchange interaction between magnetic spins and holes. Then, the density of states of the conduction band of the non-magnetic semiconductor material 22 connected to the ferromagnetic semiconductor material 21 resonates in energy with the valence band of the ferromagnetic semiconductor material 21, the spin splitting is induced in the conduction band of the non-magnetic semiconductor material 22 by the proximity effect and the spin injection effect, and the spin-polarized electrons are generated in the non-magnetic semiconductor material 22.

Figure 3:
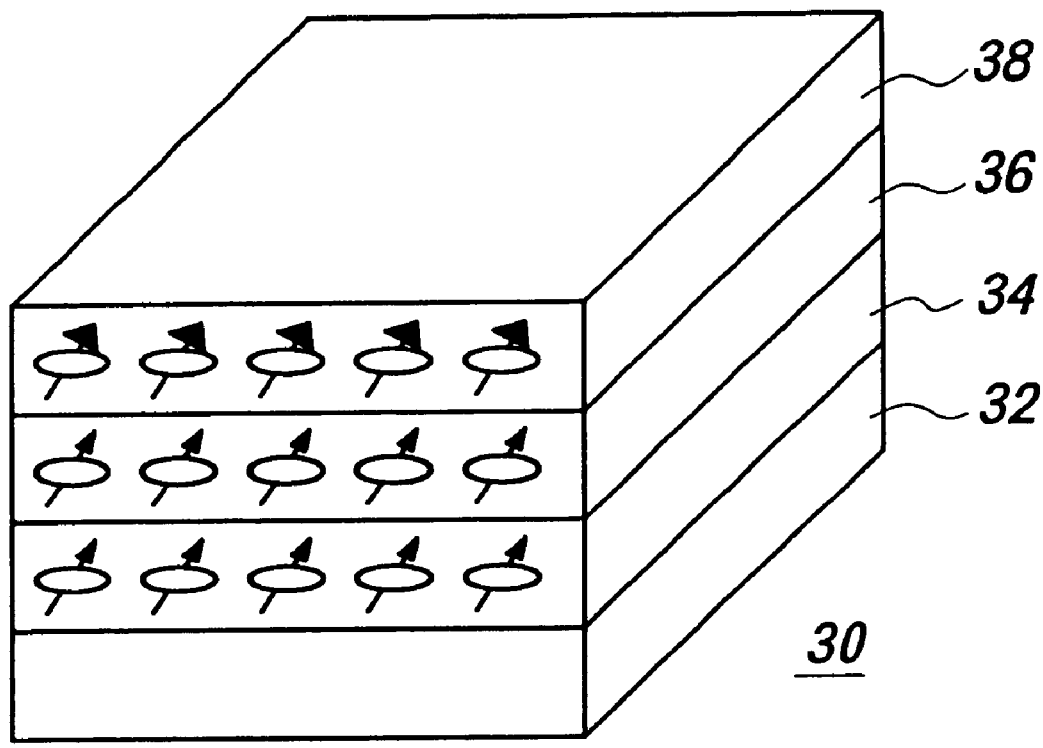
FIG. 3 is a schematic view depicting an embodiment of the semiconductor device according to the invention.

FIG. 3 is a schematic view showing the structure of an embodiment of the semiconductor device 30 having the ferromagnetic/non-magnetic semiconductor heterojunction according to the invention. On a semiconductor substrate 32, an electronic and/or optical device structure 34 is formed by any one of the well developed thin film manufacturing processes. Then, a non-magnetic semiconductor layer 36 and a ferromagnetic semiconductor layer 38 are grown on the electronic and/or optical device structure 34 by the molecular-beam-epitaxy method. In the present embodiment, the non-magnetic semiconductor layer 36 is made of InAs and the ferromagnetic semiconductor layer 38 is made of (Ga,Mn)Sb.

It should be noted that according to the invention, the magnetic semiconductor layer 38 may be made of other transition metal elements or other rare earth elements. These semiconductor material crystals can be created by the thin film crystal creating methods such as the molecular-beam-epitaxy method. Although the (Ga,Mn)Sb layer 38 may be grown at a high temperature near 550 degrees centigrade, the (Ga,Mn)Sb layer is preferably grown at a non-equilibrium extremely lower temperature (for example, about 250 degrees centigrade), because the solid solubility of magnetic element (Mn) in the III-V family semiconductor is very low.

In the semiconductor device 30, the spin-polarized electrons are generated in the non-magnetic semiconductor layer 36 as explained above with reference to FIG. 2, a new degree of freedom, i.e. the electron spin is introduced in the electronic and/or optical device structure 34. In the embodiment shown in FIG. 3, the electronic and/or optical device structure 34 and non-magnetic semiconductor layer 36 are formed by the separate semiconductor layers. However, when the semiconductor device 30 is constructed as another semiconductor device such as a spin-polarized field effect transistor in which the non-magnetic semiconductor layer 36 itself can serve as the electronic and/or optical device structure, the electronic and/or optical device structure 34 may be dispensed with.

Figure 4:
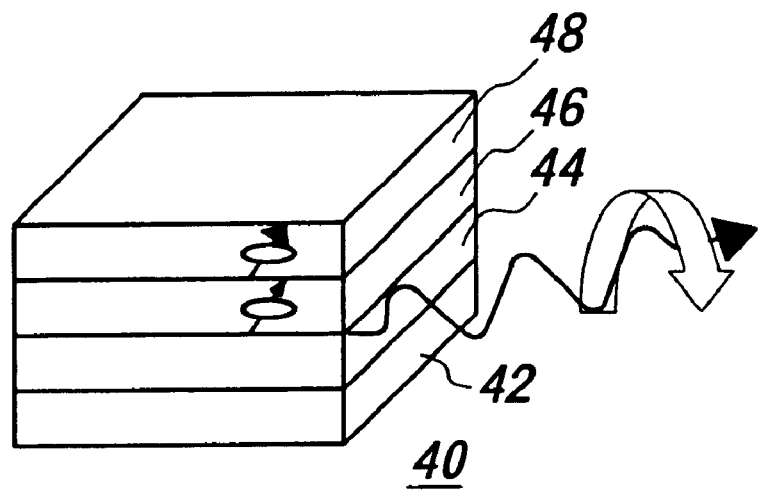
FIG. 4 is a perspective view showing a circularly polarized light emitting device according to the invention.

FIG. 4 is a perspective view showing another embodiment of the semiconductor device according to the invention. In the present embodiment, the semiconductor device is constructed as a circularly polarized light emitting device 40. The circularly polarized light emitting device 40 comprises a semiconductor substrate 42, a light emitting device structure 44 formed on the semiconductor substrate 42, a non-magnetic semiconductor layer 46 grown on the light emitting device structure 44, and a ferromagnetic semiconductor layer 48 formed on the non-magnetic semiconductor layer 46. This structure is similar to that of the semiconductor spin device 30 shown in FIG. 3. In this circularly polarized light emitting device 50, a deflection of the circularly polarized light can be controlled by the interaction between the light and the spin-polarized electrons induced in the non-magnetic semiconductor layer 46.

Figure 5:
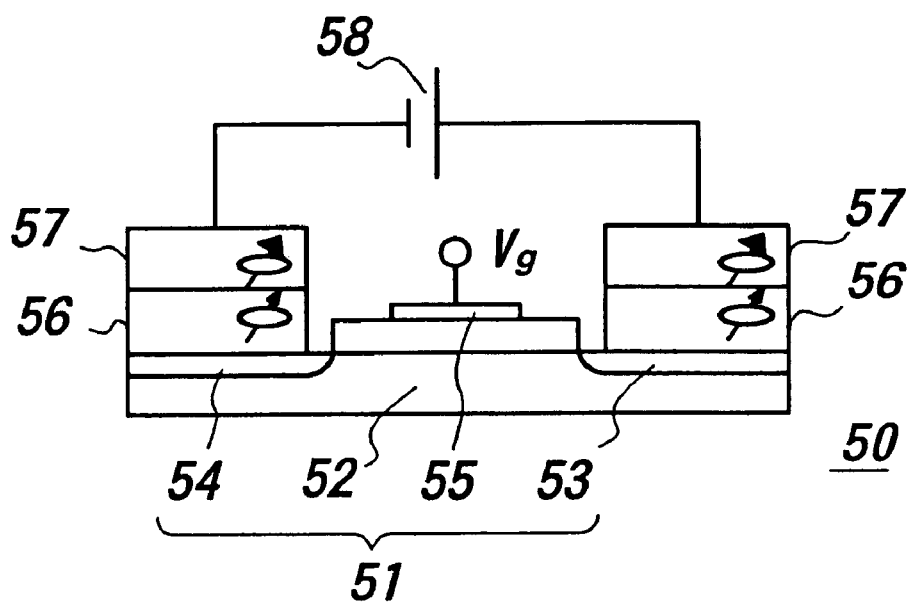
FIG. 5 is a schematic view illustrating a spin-polarized field effect transistor according to the present invention.

FIG. 5 is a schematic sectional view illustrating the structure of another embodiment of the semiconductor device according to the invention. In the present embodiment, the ferromagnetic/non-magnetic semiconductor heterostructure according to the invention is applied to a spin-polarized electronic injecting electrode. The semiconductor device is constructed as a spin-polarized field effect transistor 50. The spin polarized field effect transistor 50 comprises a general lateral type field effect transistor structure 51 including a semiconductor substrate 52, source and drain regions 53 and 54 and a gate insulating layer 54. On the source and drain regions 53 and 54, non-magnetic semiconductor layers 56 and ferromagnetic semiconductor layers 57 are successively grown to form the spin-polarized electronic injecting source and drain electrodes, and a DC voltage source 58 is connected across these electrodes. The spin-polarized field effect transistor has been discussed in S.Datta and B.Das, App. Phys. Lett. 56,665 (1990).

Figure 6:
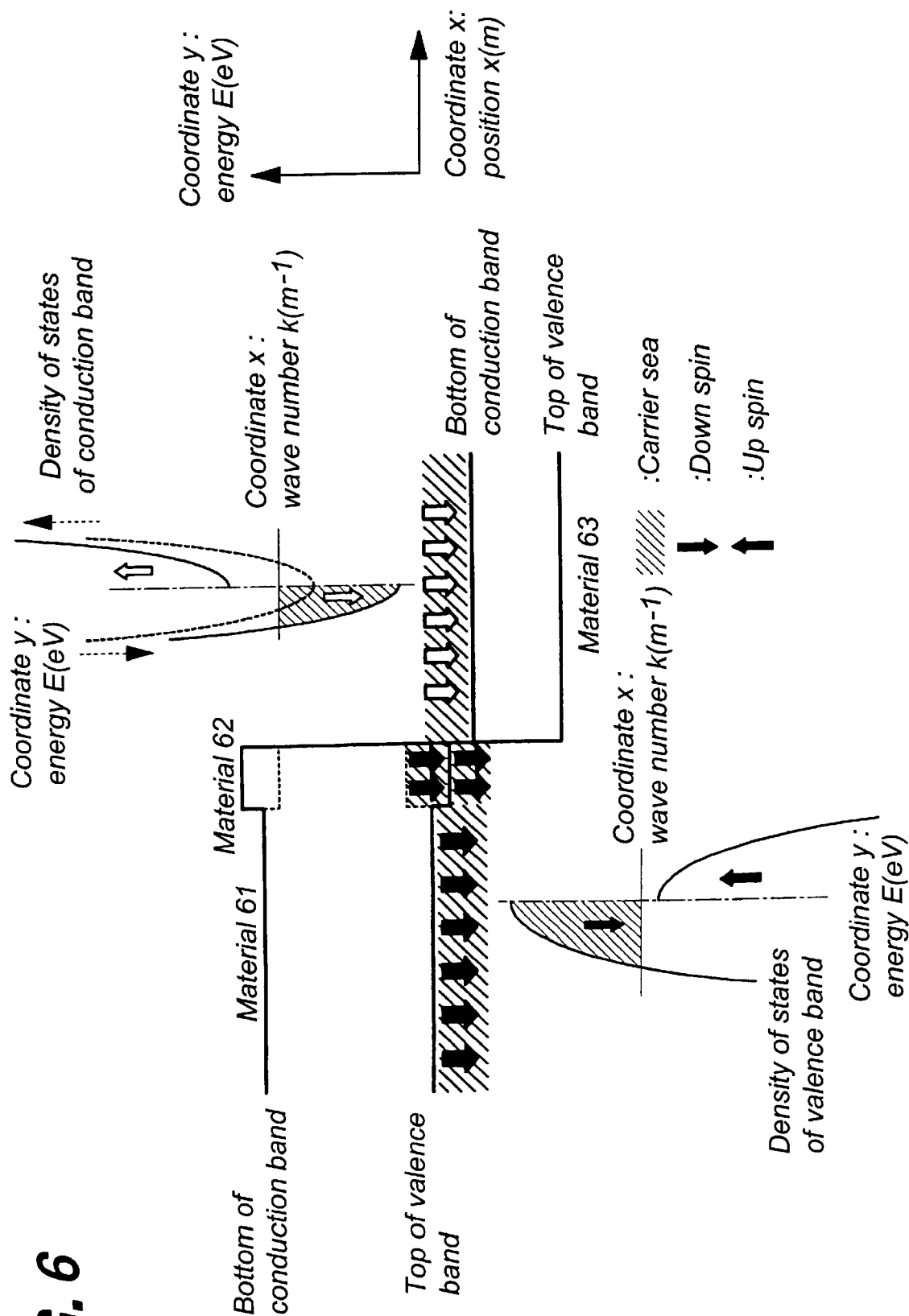
FIG. 6 is a schematic diagram representing another embodiment of the ferromagnetic/non-magnetic heterojunction for realizing the method according to the invention.

FIG. 6 is a schematic diagram illustrating another embodiment of the ferromagnetic/non-magnetic semiconductor heterojunction used in the method for generating spin-polarized conduction electrons according to the invention. A material 61 is a ferromagnetic semiconductor such as (Ga,Mn)Sb, a material 62 is a non-magnetic semiconductor such as GaSb and (Al,Ga)Sb, and a material 63 is a non-magnetic semiconductor such as InAs. The materials 61 and 62 are connected each other to constitute the junction of Type I, in which the conduction bands, the valence bands, and the energy gaps overlap partially, and the materials 62 and 63 are connected together to form the above explained junction of Type II. In such a structure, the spontaneous spin splitting is induced in the valence band of the ferromagnetic material 61 and the density of states of the valence band of the non-magnetic material 62 resonates in energy with the valence band of the ferromagnetic material 61 due to the proximity effect and spin injection effect and the spin is induced in the non-magnetic material 62 to generate spin-polarized holes. Then, the density of states of the conduction band of the non-magnetic material 63 resonates in energy with the valence band of the non-magnetic material 62 and the spin splitting is induced in the non-magnetic material 63 due to the proximity effect and the spin injection effect to generate spin-polarized electrons.

Figure 7:
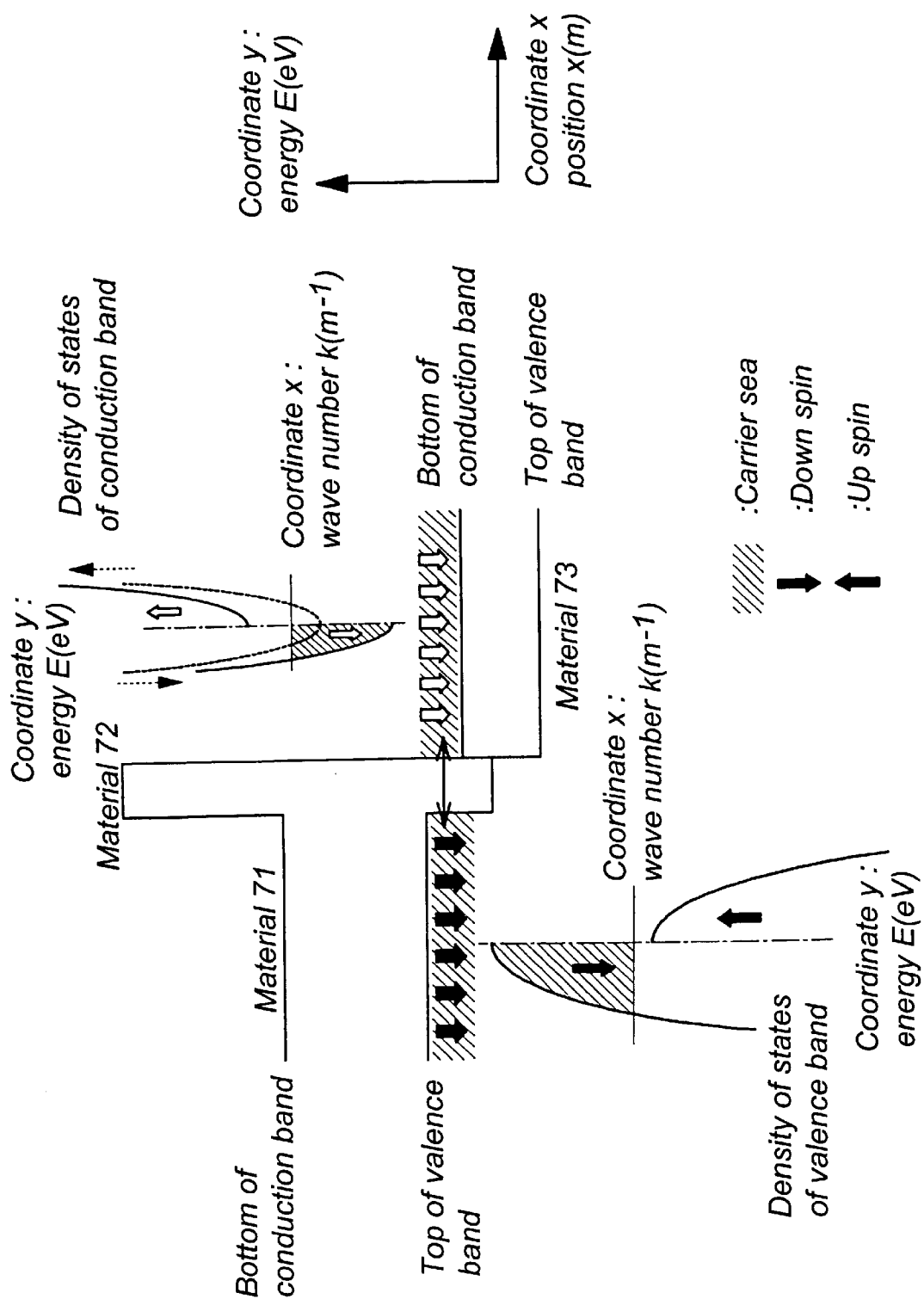
FIG. 7 is a schematic diagram showing still another embodiment of the ferromagnetic/non-magnetic heterojunction according to the invention.

FIG. 7 is a schematic diagram showing still another embodiment of the ferromagnetic/non-magnetic semiconductor heterojunction used in the method for generating spin-polarized conduction electrons according to the invention. A material 71 is a ferromagnetic semiconductor such as (Ga,Mn)Sb, a material 72 is a non-magnetic semiconductor such as AlSb and a material 73 is a non-magnetic semiconductor such as InAs. In this structure, the material 72 serves as the energy barrier between the valence band of the material 71 and the conduction band of the material 73. Even in such a case, carriers can move between the materials 71 and 73 by the tunnel effect, although the proximity effect becomes small as compared with the case shown in FIG. 2. Therefore, the spin splitting is induced in the density of states of the conduction band of the material 73 according to the spin injection effect and spin polarized electrons are generated in the non-magnetic material 73.

According to the present invention, it is possible to generate largely spin-polarized conduction electrons due to the spin splitting of the conduction band. Moreover, the ferromagnetic/non-magnetic heterostructure according to the invention may be advantageously utilized as the spin injection electrode in the electron and/or optical device structure, because this heterostructure constitutes the semiconductor/semiconductor junction.

What is claimed is:

1. A method of generating spin-polarized conduction electrons, characterized in that the method comprises a step of providing a ferromagnetic/non-magnetic semiconductor heterojunction between a ferromagnetic semiconductor layer and a non-magnetic semiconductor layer having an energy band alignment of Type II with respect to the ferromagnetic semiconductor layer, and a step of inducing a spin splitting of a conduction band of the non-magnetic semiconductor layer by a spontaneous spin splitting of a valence band of the ferromagnetic semiconductor layer to generate spin-polarized conduction electrons, wherein said ferromagnetic semiconductor layer is made of (Ga,Mn)Sb or another GaSb—based composition which includes at least one other transition metal or rare earth elements.

2. A method as claimed in claim 1, wherein said ferromagnetic/non-magnetic semiconductor heterojunction is formed by directly joining the ferromagnetic semiconductor layer and the non-magnetic semiconductor layer each other.

3. A method as claimed in claim 2, wherein said ferromagnetic semiconductor layer is made of (Ga,Mn)Sb and said non-magnetic semiconductor layer is made of InAs.

4. A method as claimed in claim 1, wherein said ferromagnetic/non-magnetic semiconductor heterojunction is formed by joining the ferromagnetic semiconductor layer and the non-magnetic semiconductor layer with interposing therebetween another non-magnetic semiconductor layer having an energy band alignment of Type I with respect to the ferromagnetic semiconductor layer.

5. A method as claimed in claim 4, wherein said ferromagnetic semiconductor layer is made of (Ga,Mn)Sb, said non-magnetic semiconductor layer is made of InAs, and said another non-magnetic semiconductor layer is made of GaSb or (Al,Ga)Sb.

6. A method as claimed in claim 1, wherein said ferromagnetic/non-magnetic semiconductor heterojunction is formed by joining the ferromagnetic semiconductor layer and the non-magnetic semiconductor layer with interposing therebetween a energy barrier layer.

7. A method as claimed in claim 6, wherein said ferromagnetic semiconductor layer is made of (Ga,Mn)Sb, said non-magnetic semiconductor layer is made of InAs, and said energy barrier layer is made of AlSb.

* * * * *